United States Patent
Yabuuchi

(10) Patent No.: US 11,398,272 B2
(45) Date of Patent: Jul. 26, 2022

(54) SEMICONDUCTOR MEMORY DEVICE

(71) Applicant: RENESAS ELECTRONICS CORPORATION, Tokyo (JP)

(72) Inventor: Makoto Yabuuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/095,000

(22) Filed: Nov. 11, 2020

(65) Prior Publication Data

US 2021/0142849 A1  May 13, 2021

(30) Foreign Application Priority Data

Nov. 11, 2019 (JP) .............................. JP2019-203634

(51) Int. Cl.
  *G11C 11/418* (2006.01)
(52) U.S. Cl.
  CPC .................. *G11C 11/418* (2013.01)
(58) Field of Classification Search
  CPC ..................................................... G11C 11/418
  See application file for complete search history.

(56) References Cited

U.S. PATENT DOCUMENTS

| 6,064,607 A * | 5/2000 | Miki ......................... G11C 8/10 365/200 |
| 10,573,395 B1 * | 2/2020 | Yang ................... G11C 16/3427 |
| 2020/0075070 A1 * | 3/2020 | Gupta ....................... G11C 8/08 |

FOREIGN PATENT DOCUMENTS

JP  2013-149332 A  8/2013

* cited by examiner

*Primary Examiner* — Min Huang
(74) *Attorney, Agent, or Firm* — McDermott Will & Emery LLP

(57) ABSTRACT

Along with the miniaturization of the semiconductor memory device, the resistor and parasitic capacitance of the wires become large, which prevents the semiconductor memory device from being speeded up. In a semiconductor memory device having a semiconductor substrate having a main surface, a first memory cell row having a plurality of first memory cells arranged in parallel to a first direction in plan view on the main surface, a first word line connected to the plurality of first memory cells, a first word line driver for changing a potential of the first word line, and a control circuit for outputting a first predecode signal to the first word line driver via the first predecode line in response to a clock signal and an address signal, a repeater is inserted between the control circuit and the first word line driver.

13 Claims, 16 Drawing Sheets

SEMICONDUCTOR MEMORY DEVICE

CROSS-REFERENCE TO RELATED APPLICATIONS

The disclosure of Japanese Patent Application No. 2019-203634 filed on Nov. 11, 2019 including the specification, drawings and abstract is incorporated herein by reference in its entirety.

BACKGROUND

The present invention relates to a semiconductor memory device, and, for example, to a technique effective when applied to a semiconductor memory device having a predecoder.

In a semiconductor memory device, a configuration is generally used in which an address signal is decoded by a predecoder to select a predecode line and a single word line is selected by a main decoder in accordance with a selection result of the predecode line when data is input/output to/from a memory cell.

Semiconductor memory device using a fine device such as a FinFET, the wiring resistance is large because the width of the wiring is narrow, the delay of the signal transmitted through the wiring is large. In particular, the predecode line is remarkably affected by parasitic capacitance caused by a circuit such as a decoder or a driver connected to the predecode line in addition to the influence of wiring resistance, so that the delay of the predecode signal transmitted through the predecode line is large. As a result, there is a long delay from the input of the address signal into the memory circuit to the transmission of the predecode signal through the predecode line and the selection of the word line in accordance with the predecode signal. Then, the input and output of data to and from the memory cell is delayed. That is, with the semiconductor memory device is miniaturized, the parasitic capacitance of the wiring resistance and wiring is increased, there is a problem that the speed of the semiconductor memory device is hindered.

In this regard, there is a disclosed technique below.

[Patent Document 1] Japanese Unexamined Patent Application Publication No. 2013-149332

Other problems and novel features will become apparent from the description of the specification and drawings.

SUMMARY

A semiconductor memory device according to an embodiment includes a semiconductor substrate having a main surface, a first memory cell row having a plurality of first memory cells arranged in parallel to a first direction in plan view on the main surface, a first word line connected to the plurality of first memory cells, a first word line driver for changing a potential of the first word line, and a control circuit for outputting a first predecode signal to the first word line driver via the first predecode line in response to a clock signal and an address signal, and a repeater is inserted between the control circuit and the first word line driver.

A semiconductor memory device according to another embodiment includes: a semiconductor substrate having a main surface; a first memory cell row having a plurality of first memory cells arranged in parallel to in a first direction in a plan view on the main surface; a first word line connected to the plurality of first memory cells; a first word line driver arranged in a first direction in an extending direction of the first memory cell row and varying a potential of the first word line in a first direction; a memory well tap region arranged in a second direction in an extending direction of the first memory cell row and feeding wells to the first memory cells; a peripheral well tap region arranged in a extending direction of the word line driver and feeding wells to the word line driver in a first direction and arranged in an extending direction of the memory well tap region in a first direction; a control circuit for outputting a first predecode signal to the first word line driver via the first predecode line in response to a clock signal and an address signal; and a first predecode line A first portion from the control circuit to the first repeater disposed in the peripheral well tap region and a second portion from the first repeater to the first word line driver.

In the semiconductor memory device according to one embodiment, the operation speed of the semiconductor memory device can be increased.

DETAILED DESCRIPTION

Figure 1:
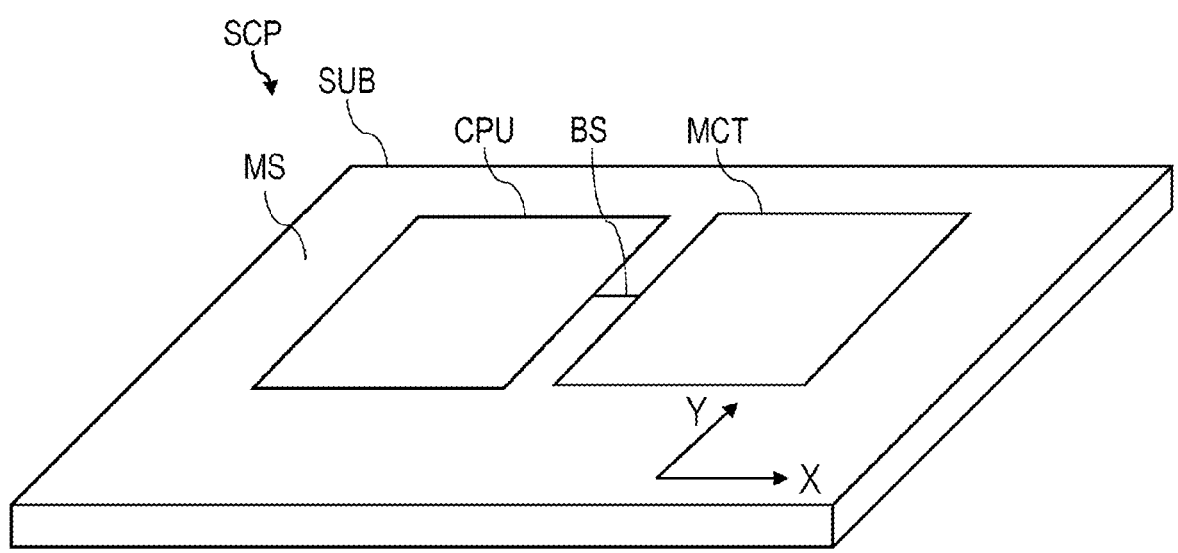
FIG. 1 is an example of a perspective view of a semiconductor memory device according to a first embodiment.

Hereinafter, a semiconductor memory device according to an embodiment will be described in detail with reference to the drawings. In the specification and the drawings, the same or corresponding constituent elements are denoted by the same reference numerals, and a repetitive description thereof is omitted. In the drawings, for convenience of description, the configuration may be omitted or simplified. In addition, at least a part of the embodiment and each modification may be arbitrarily combined with each other.

Figure 15:
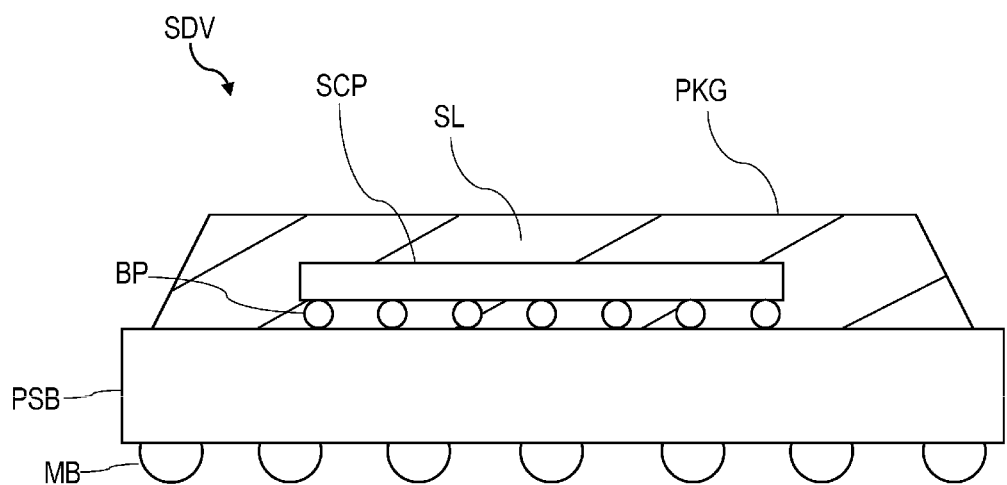
FIG. 15 is a cross-sectional view of a semiconductor memory device according to the first embodiment.

FIG. 1 is a perspective view of a semiconductor chip SCP included in a semiconductor memory device SDV according to a first embodiment. FIG. 15 is a cross-sectional view of the semiconductor memory device SDV according to the first embodiment. The semiconductor memory device SDV includes a semiconductor chip SCP, a package PKG, and a package substrate PSB.

On one surface of the semiconductor chip SCP, a plurality of bumps BP is formed which is an external electrode of the semiconductor chip SCP. The plurality of bumps BP are made of a conductive material. Then, the semiconductor chip SCP is connected via a plurality of bumps BP, on one surface of the package substrate PSB. The package substrate PSB, conductive wiring (not shown) is provided. Then, on the other surface of the package substrate PSB, a plurality of metal balls MBL are formed. A plurality of metal balls MBL, for example, made of a conductive metal such as solder. Package substrate PSB via a metal ball MBL is mounted on another wiring board (not shown) or the like. It is possible to input and output signals to and from the semiconductor chip SCP from the outside of the semiconductor memory device SDV through the metal ball MBL, the conductive wiring provided on the package substrate PSB, and the bump BP. Then, the semiconductor chip, in the package PKG provided so as to cover one surface of the package substrate, is sealed with a sealant SL made of an insulator such as a resin.

Semiconductor chip SCP has a semiconductor board SUB. The semiconductor substrate SUB is made of a semiconductor such as silicon. Semiconductor substrate SUB has a main surface MS, above the main surface MS of the semiconductor substrate SUB, a multilayer wiring layer (not shown) is formed. The multilayer wiring layer includes a plurality of wiring layers, each wiring layer is insulated from each other through the interlayer insulating film of the insulator. Further, the wiring included in each wiring layer is electrically connected to each other via conductive vias formed through the interlayer insulating film. Hereinafter referred to as a plan view when viewed main surface from a direction perpendicular to the main surface. Then, in plan view, when the first direction on the main surface and the X direction, referred to as the Y direction the direction intersecting the X direction. A central processing unit CPU and a memory circuit MCT are formed on the main surface MS. The central processing unit CPU and the memory circuit MCT are connected to each other via a bus BS which is a path for transmitting signals. The central processing unit CPU performs arithmetic processing using data stored in the memory circuit MCT.

Figure 2:
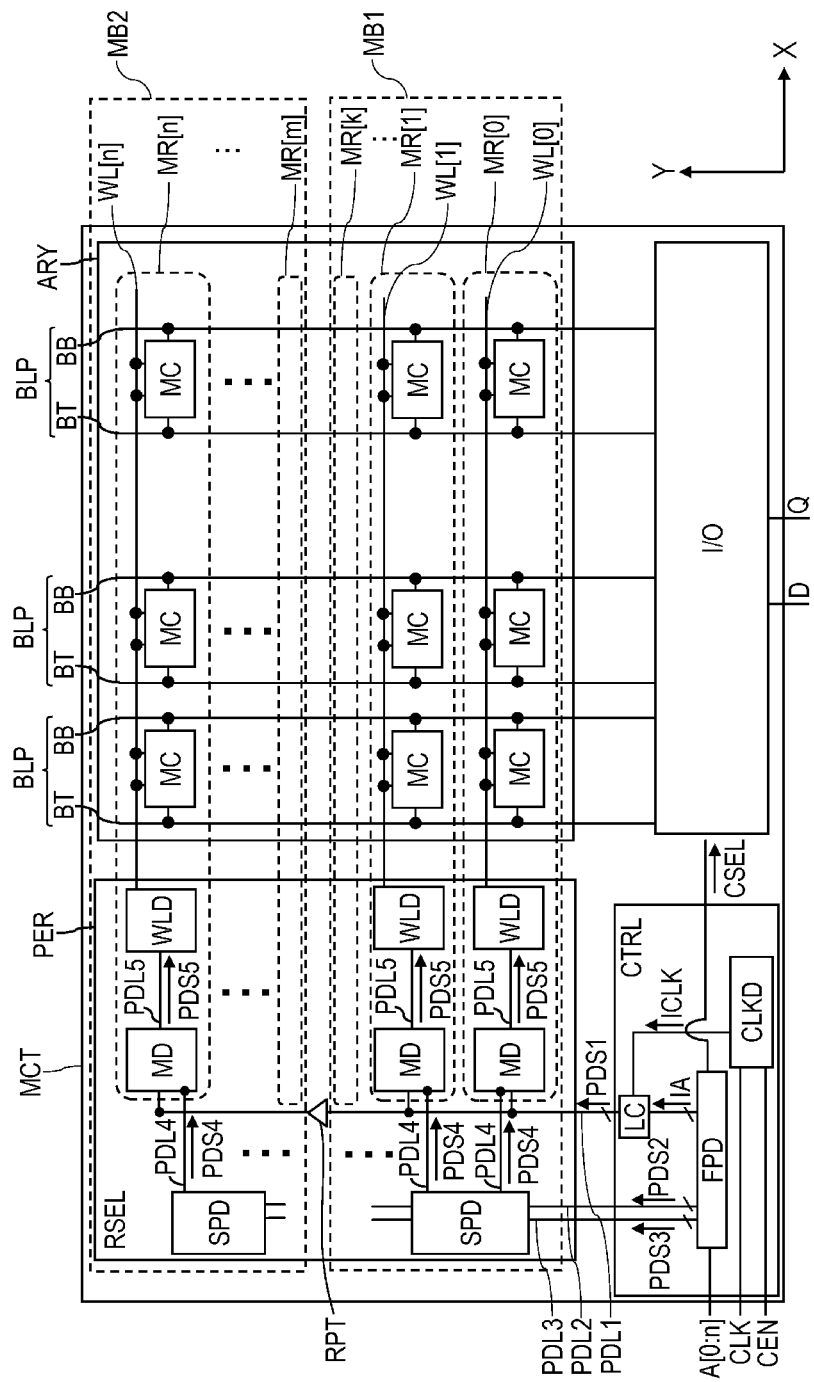
FIG. 2 is an example of a block diagram of the semiconductor memory device in the first embodiment.
Figure 3:
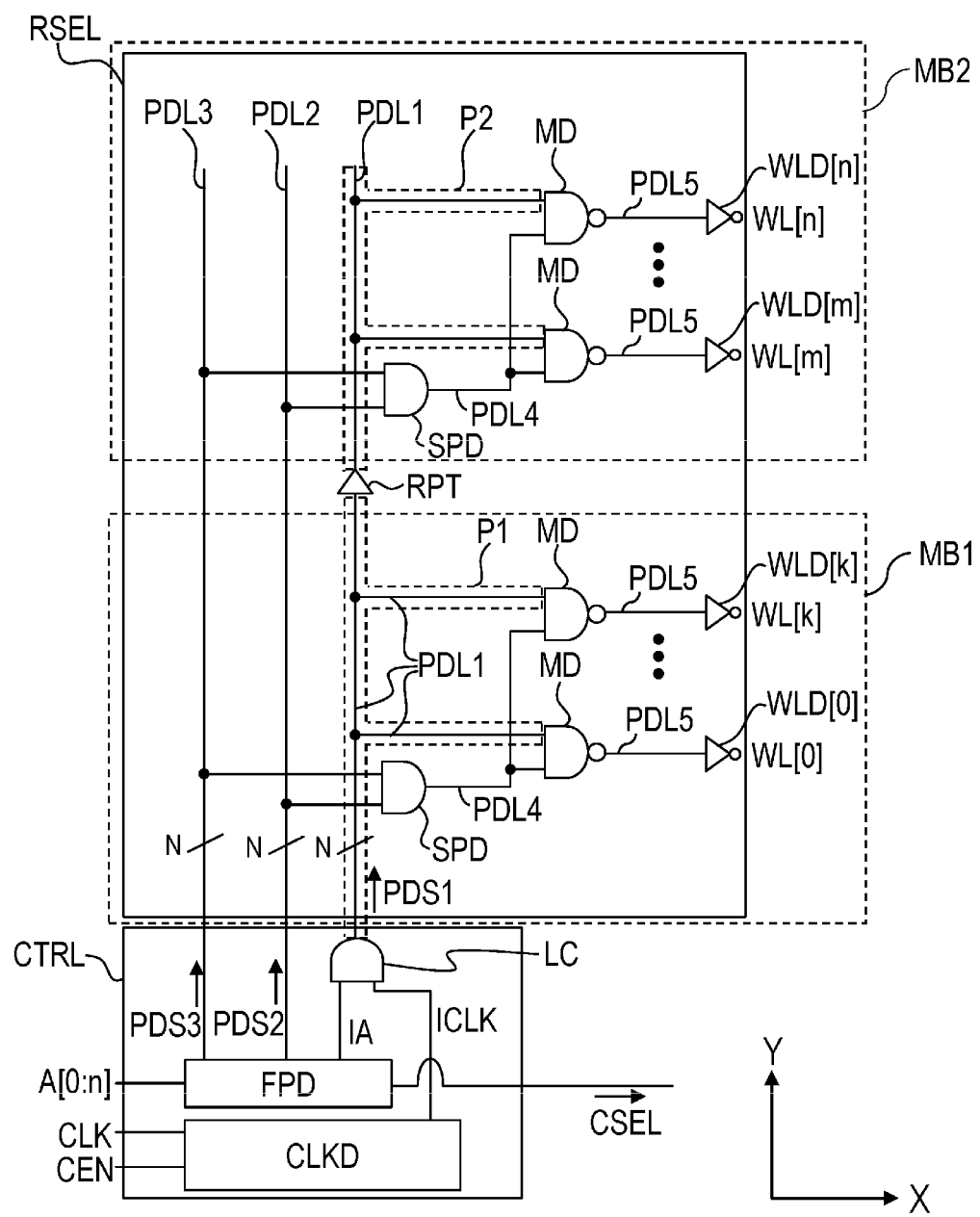
FIG. 3 is an example of a circuit diagram of a main portion of the semiconductor memory device according to the first embodiment.

FIG. 2 is a block diagram of the memory circuit MCT according to the first embodiment. The memory circuit MCT has a memory cell array ARY, a control circuit CTRL, a row select circuit RSEL, and an input/output circuit I/O. FIG. 3 is a detailed circuit diagram of a row select circuit RSEL and a control circuit CTRL.

The memory cell array ARY includes a plurality of memory cell rows MR, a plurality of word lines WL, and a plurality of bit line pairs BLP.

Each memory cell row MR includes a plurality of memory cells MC arranged in parallel to the X direction in plan view. The memory cell rows are arranged in the order of the 0th memory cell row MR[0], the 1st memory cell row MR[1], and the nth memory cell row MR[n] from the side closer to the control circuits CTRL in the Y-direction. After this, unless otherwise noted, n denotes an integer equal to or greater than 0. In addition, if brackets [ ] are not followed by a sign, the components in any row are indicated. For example, the notation memory cell row MR refers to any memory cell row.

The memory cell MC is, for example, a static random access memory (SRAM). Transistors constituting the memory cell MC is, for example, a fin-type field-effect transistor (FinFET). Each memory cell row MR includes a plurality of memory cells MC arranged in parallel to the X direction in plan view.

The word line WL is connected to a plurality of memory cells MC of each memory cell row MR. More specifically, the word line WL is connected to a gate electrode of an access transistor (not shown) included in the memory cell MC. The bit line pair BLP consists of a pair of bit lines BT and BB, and is provided for each memory cell row consisting of a plurality of memory cells MC arranged in parallel to the Y direction. Bit lines BT and BB are commonly connected to a plurality of memory cells MC included in each column. Word line WL and bit line pair BLP are included in any of the multilayer wiring layers. The wiring layer including the word line WL and the wiring layer including the bit line pair BLP are different wiring layers from each other.

The control circuit CTRL has a first pre-decoder FPD, a clock driver CLKD, and a logic circuit LC.

The first pre-decoder FPD outputs an internal address signal IA to the logic circuit LC in response to the input address signal A, and outputs a second pre-decoded signal PDS2 to the second pre-decode line PDL2, and outputs a third pre-decoded signal PDS3 to the third pre-decode line PDL3. Furthermore, the first pre-decoder FPD, in response to the address signal A, and outputs a column select signal CSEL to the input-output circuit I/O. Each of the first to third predecode lines PDL1, PDL2 and PDL3 is composed of a plurality of wirings. In the example shown in FIG. 3, the first to third pre-decode line PDL1, PDL2, and PDL3, N as a positive integer, each consists of N wires.

A repeater RPT is inserted into the first predecode line PDL1 at a position between the control circuit CTRL and the main decoder MD. Hereinafter, k is an integer of 0 or more, and m is an integer larger than k. In the example shown in FIG. 2, the repeater RPT is provided between the memory cell row MR [k] of the k-th row and the memory cell row MR [m] of the m-th row. In other words, the repeater RPT is inserted into a portion of the first predecode line PDL1 between the control circuit CTRL and the word line driver WLD[m], but the repeater RPT is not inserted into a portion between the control circuit CTRL and the word line driver WLD[k]. The first predecode line PDL1 has a first portion P1 from the repeater to the control circuit and a portion P2 from the repeater to the main decoder.

The repeater RPT is not inserted into the second predecode line PDL2 and the third predecode line PDL3.

Repeater RPT, in response to the signal given from the first portion P1 of the first pre-decode line PDL1, the second portion P2 of the first pre-decode line PDL1, supplies the power supply potential VDD (e.g., 0.8V) or ground potential VSS (e.g., 0V). For example, when the first pre-decoded signal of the high level (power supply potential VDD) is input from the first portion P1 to the repeater RPT, the repeater, for the second portion, the power supply potential VDD corresponding to the high level to supply the second portion. On the other hand, when the first pre-decoded signal of the low level (ground potential VSS) is input to the repeater RPT from the first portion P1, the repeater, for the second portion, supplies the ground potential VSS corresponding to the low level to the second portion.

Figure 4:
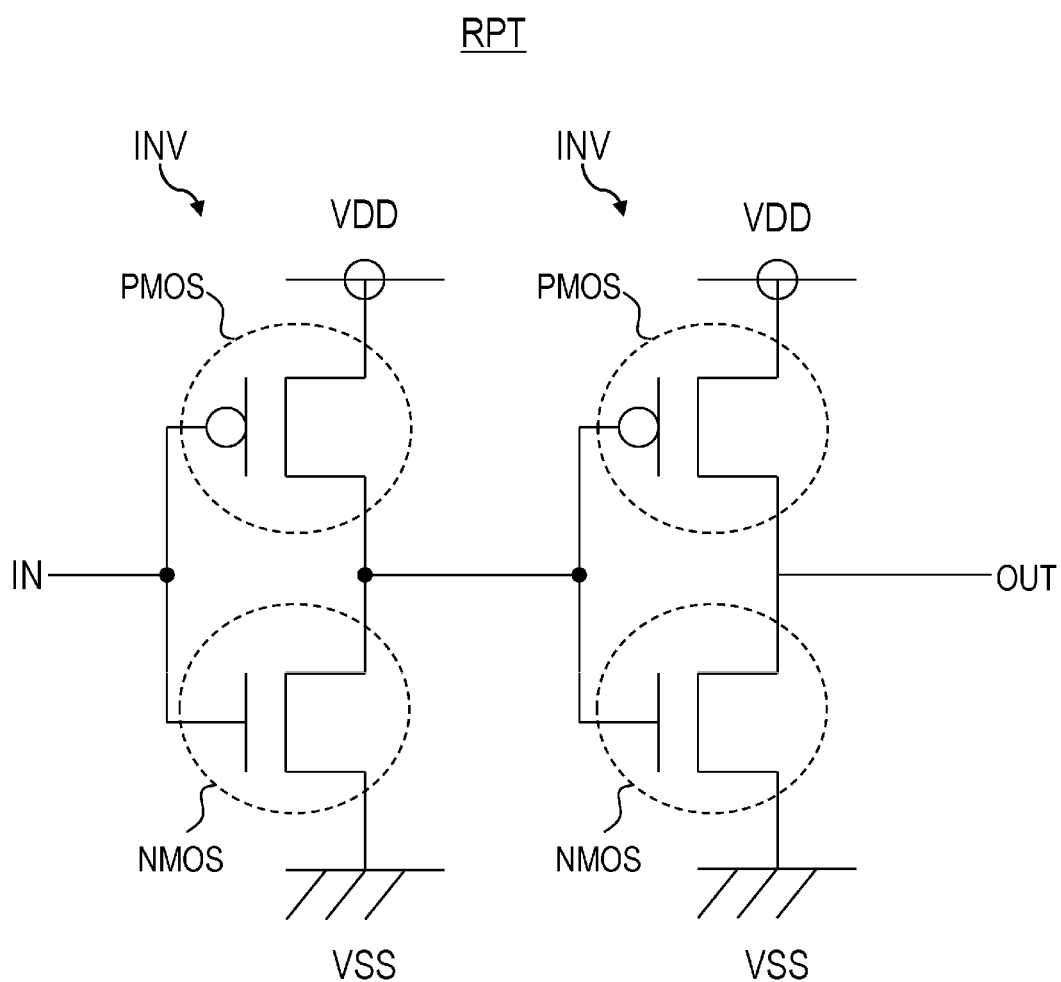
FIG. 4 is an example of a circuit diagram of a repeater according to the first embodiment.

A specific configuration of the repeater RPT is an even number of CMOS inverters INV connected in series, as shown in FIG. 4. Each CMOS inverter INV has a configuration in which the p-channel type field-effect transistor PMOS and the n-channel type field-effect transistor NMOS are connected in series between the power supply potential VDD and the ground potential VSS. The source of the p-channel field-effect transistor PMOS is supplied with a power supply potential VDD. The source of the p-channel field-effect transistor NMOS is supplied with a ground potential VSS. The drain of the p-channel field-effect transistor PMOS and the drain of the n-channel field-effect transistor NMOS are connected to each other. The input portion IN of the repeater is a node in which the gate of the p-channel field-effect transistor PMOS and the gate of the n-channel field-effect transistor NMOS are commonly connected. The output portion OUT of the repeater is a node in which the drain of the p-channel field-effect transistor PMOS and the drain of the re-channel field-effect transistor NMOS are commonly connected.

The address signal A is a signal for selecting a specific memory cell MC from a plurality of memory cells MC included in the memory cell array ARY. Clock driver CLKD, in response to the clock signal CLK and the clock enable signal CEN inputted, and outputs the internal clock signal ICLK to the logic circuit LC. Clock signal CLK is a signal for determining the timing of the operation of the memory circuit MCT, a signal for repeating a high level (e.g., power supply potential VDD) and a low level (e.g., ground potential VSS) at a predetermined period. The clock enable signal CEN is a signal that controls whether the clock signal is valid or invalid.

The logic circuit LC consists of an AND circuit. The logic circuit LC is connected to the first predecoder FPD, the clock driver CLKD, and the first predecode line PDL1. Depending on the product logic of the input internal address signal IA and the internal clock signal ICLK, and outputs a first pre-decoded signal PDS1 to the first pre-decode line PDL1.

The row selection circuits RSEL include a second predecoder SPD, a main decoder MD, and word-line drivers WLD. The row selection circuits RSEL select the corresponding memory cell rows MR[n] in accordance with the address signals A[n].

The second pre-decoder SPD consists of an AND circuit. The second pre-decoder SPD is provided for each of the plurality of memory cell rows MR. The second predecoder SPD is connected to the first predecoder FPD via the second predecode line PDL2 and the third predecode line PDL3, and is connected to the plurality of main decoders MD via the plurality of fourth predecode lines PDL4. The second predecoder SPD receives the second predecode signal PDS2 via the second predecode line PDL2, and the third predecode signal PD3 via the third predecode line PDL3. Then, the second predecoder SPD selects one main decoder MD from the plurality of main decoders MD in accordance with the product-logic of the second predecode signal PDS2 and the third predecode signal PDS3. When the second pre-decoder SPD selects one main decoder MD, the fourth pre-decoded signal PDS4 is output to the main decoder MD to be selected via the fourth pre-decode line PDL4. That is, the second pre-decoder SPD selects one main decoder MD from the plurality of main decoders MD according to the decoding result of the first pre-decoder FPD.

The main decoder MDs consist of NAND circuitry. The main decoder MD is connected to the logical circuit LC via the first predecode line PDL1, to the second predecoder SPD via the fourth predecode line PDL4, and to the word line driver WLD via the fifth predecode line PDL5. The Main Decoder MD outputs the fifth pre-code signal PDS5 to the word line driver WLD according to the negative logic of the first pre-code signal PDS1 and the fourth pre-code signal PDS4, and selects the word line driver WLD. That is, the main decoder MD selects the word line driver WLD according to the decoding result of the first pre-decoder and the decoding result of the second pre-decoder.

The word line driver WLD is provided corresponding to the word line WL of each row. The word line driver WLD is supplied with a power supply potential VDD (e.g., 0.8V) and a ground potential VSS (e.g., 0V) having a voltage value lower than the power supply potential. The word line driver WLD supplies the power supply potential or ground potential to the word line WL in response to the signal PDS5 provided from the main decoder MD. That is, the word line driver WLD changes the potential of the word line WL in accordance with the signal PDS5 as a result of decoding the address signal A. The supply of the power supply potential VDD to the word line WL by the word line driver WLD is also referred to as "activating the word line".

I/O circuit I/O has a column selection circuit, a light amplifier, and a sense amplifier which is not shown. The column select circuit selects a bit line pair BLP of one column according to the column select signal CSEL to connect the selected bit line pair BLP with the sense amplifier or the write amplifier. The write amplifier changes the potential of the bit line pair BLP in accordance with the input signal data D, and inputs the input data D to the memory cell MC. That is, the write amplifier writes data to the memory cell MC. The sense amplifier detects and amplifies a potential difference between the bit line BT and the bit line BB included in the bit line pair BLP of each column, and outputs output data Q. That is, the sense amplifier is used to read data from the memory cell MC.

Each memory block MB1, MB2 is defined as an area including a memory cell row MR of a predetermined number of rows among a plurality of memory cell rows MR, a word line driver WLD corresponding to the memory cell row MR, a main decoder MD, and a second pre-decoder SPD. For example, as will be described later, a memory block is partitioned for each well tap region WTR in which well power is supplied. In other words, the well tap regions WTRs are arranged at the borders of the memory blocks MB1, MB2. In this embodiment, k, m, n is an integer equal to or greater than 1, m is greater than k, and n is an integer greater than m, the memory cell rows MR and the corresponding word line driver WLD and the main decoder MD of rows 0 to k are included in the memory block MB1. The memory cell row MR and the corresponding word line driver WLD and main decoder MD from row m to row n are included in the memory block MB2.

Figure 5:
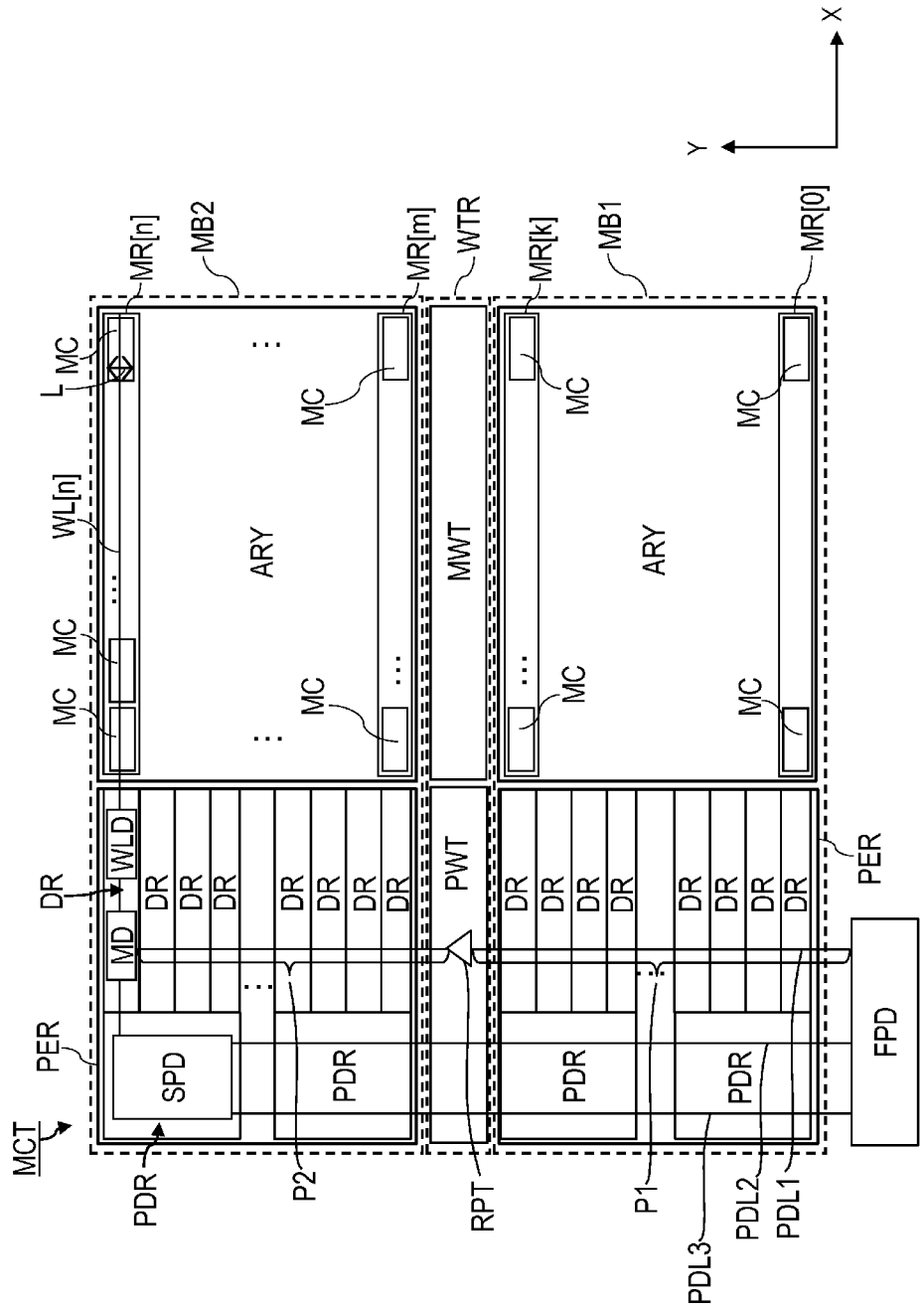
FIG. 5 is an example of a plan layout diagram of the semiconductor memory device according to the first embodiment.

FIG. 5 is a plan layout view of a memory circuit MCT in the first embodiment. The memory circuits MCT include a memory block MB1, a memory block MB2, and a well tap area WTR.

The memory block MB1 and the memory block MB2 each have a memory cell array ARY and a peripheral region PER. In this drawing, the memory block MB1 and the memory block MB2 are rectangular regions having sides in the X direction and the Y direction, respectively.

The memory cell array ARY includes a plurality of memory cell rows MR arranged consecutively in the Y direction. Each memory cell row MR includes a plurality of memory cells MC arranged in line symmetry or point symmetry with respect to each other in succession in the X direction. The plurality of memory cells MC are arranged in a rectangular region having a length L in the Y direction. It can be said that the memory cell array ARY has a plurality of memory cells MC arranged in a matrix. The word lines WL are arranged so as to overlap the memory cell rows MR in plan view.

The peripheral region PER is arranged in the extending direction of the memory cell array ARY in the X direction. The peripheral region PER has a driver region DR and a predecoder region PDR.

The driver region DR is provided for each memory cell row MR, and is formed in the extending direction of the memory cell row MR in the X direction. It can be said that the driver area DR is adjacent to the memory cell row MR in the X direction. In each driver region DR, a word line driver WLD and a main decoder MD are arranged. The word line driver WLD and the main decoder MD are arranged on the same straight line in the X direction, and the word line driver WLD is arranged at a position closer to the memory cell MC than the main decoder MD in the X direction.

The pre-decoder region PDR is a region containing the second pre-decoder SPD. The predecoder region PDR is provided for each of a plurality of memory cell rows MR, and is arranged in the extending direction of the driver region DR in the X direction. It can be said that the predecoder layer PDR is adjacent to the driver region DR in the X direction. In FIG. 5, one pre-decoder region PDR is provided for each memory cell row MR of four rows. It can also be said that the predecoder region PDR is arranged in the extending direction in the X direction of the memory array ARY. The predecoder region PDR is arranged such that the driver region DR is between the predecoder region PDR and the memory cell array ARY in the X direction.

The well tap area WTR is disposed between the memory block MB1 and the memory block MB2 in the Y-direction. The well tap region WTR includes a memory well tap region MWT and a peripheral well tap region PWT.

The memory well tap region MWT supplies power to the well of the memory cell MC. The memory well tap region MWT is arranged in the extending direction of the memory cell array ARY in the Y direction.

The peripheral well tap region PWT performs well power feeding to the word line driver WLD, the main decoder MD, and the second pre-decoder SPD. The peripheral well tap region PWT is disposed in the extending direction in the Y direction of the driver region DR and the pre-decoder region PDR. The memory well tap region MWT is arranged in the extending direction in the X direction of the memory well tap region MWT. The memory well tap region MWT may be said to be adjacent to the memory well tap region MWT in the X direction.

The first predecoder FPD is arranged in the extending direction of the memory block MB1 in the Y direction. It can be said that the first predecoder FPD adjoins the memory block MB1 in the Y-direction. In the Y-direction, the distance from the first predecoder FPD to the memory block MB2 is longer than the distance from the first predecoder FPD to the second memory block MB1.

The first pre-decode line PDL1, in a plan view, extends in the Y direction so as to overlap the driver area DR. The first part P1 of the first predecode line PDL1 is arranged so as to overlap the plurality of driver regions DR included in the memory block MB1 in plan view. The second part P2 of the first predecode line PDL1 is arranged so as to overlap the plurality of driver regions DR included in the memory block MB2 in plan view.

The repeater RPT is provided on the peripheral well tap region PWT. In the example shown in FIG. 5, the repeater RPT is not provided in the driver region DR or the memory well tap region MWT.

The second predecode line PDL2 and the third predecode line PDL3 extend in the Y-direction so as to overlap with the predecoder region PDR in plan view. In the X-direction, the second predecode line PDL2 is arranged between the first predecode line PDL1 and the third predecode line PDL3.

Figure 6A:
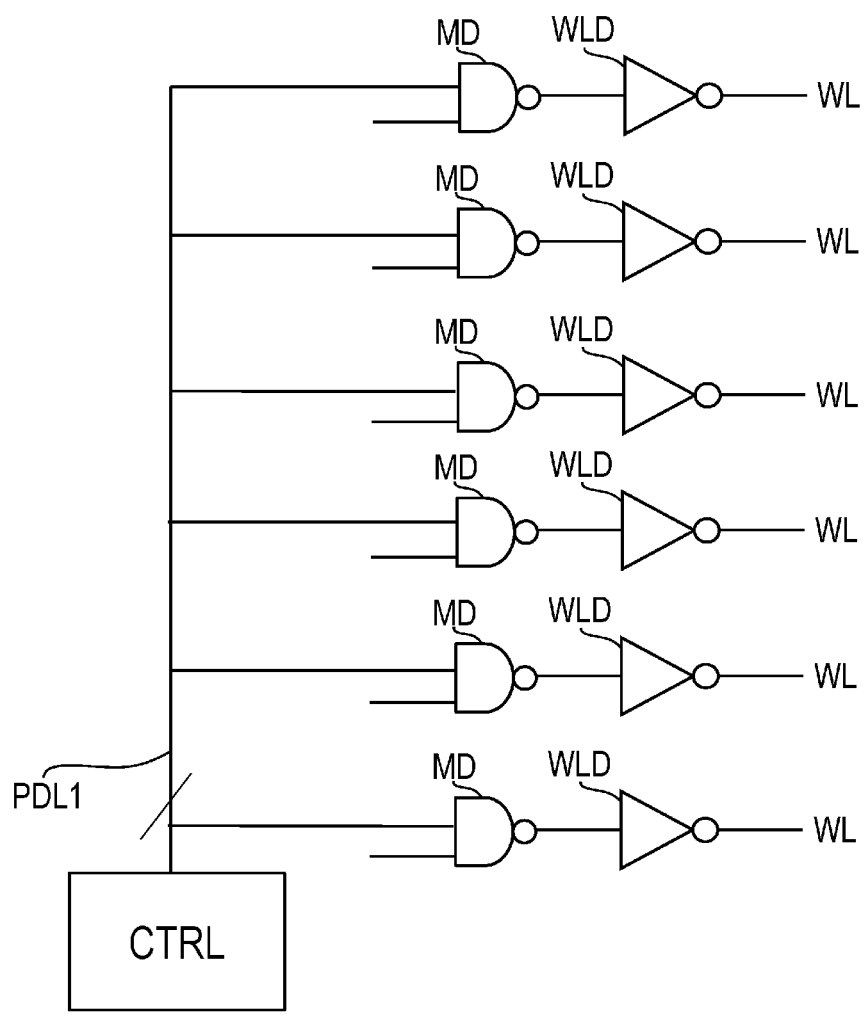
FIG. 6A is a diagram illustrating a problem.
Figure 6B:
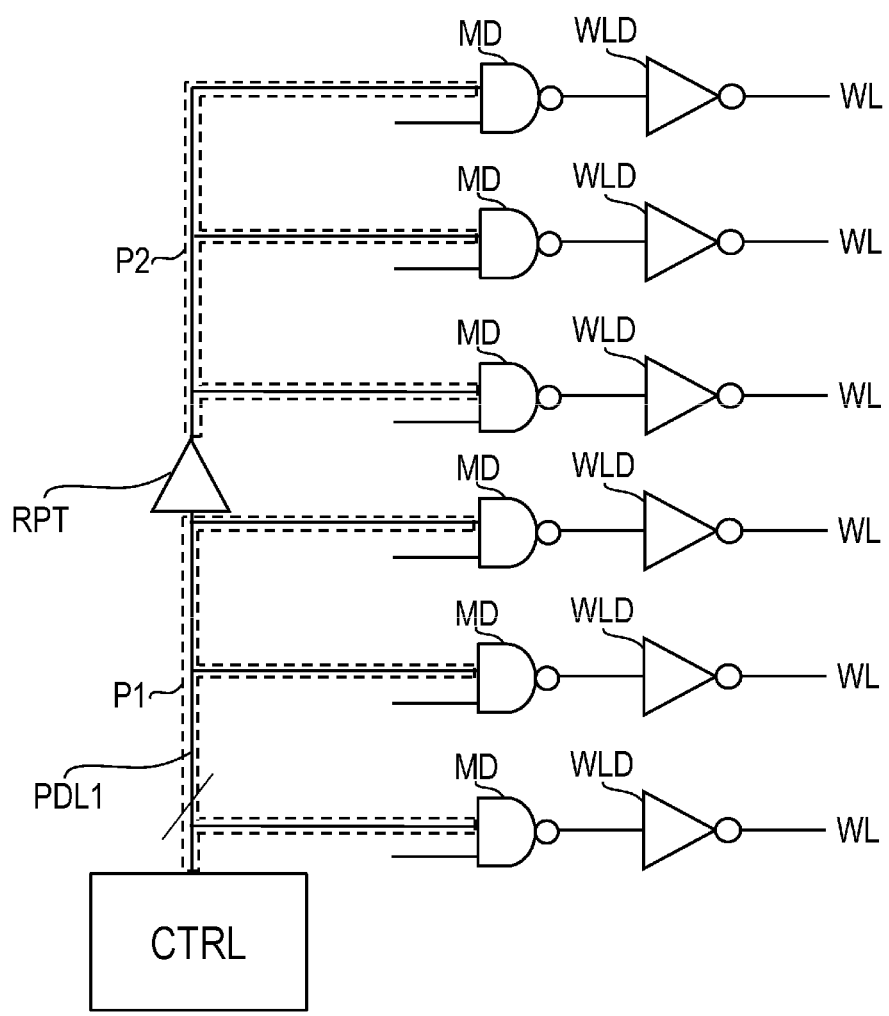
FIG. 6B is a diagram illustrating the effectiveness of the first embodiment.

FIG. 6A is a diagram for explaining the problem, and FIG. 6B is a diagram for explaining the effects of the first embodiment. In the illustrated 6A, six main decoders MD are connected to the first predecode line PDL1. Considering the number of fanouts indicating the number of logical gates connected to one wire, the number of fanouts of the first predecode line PDL1 is 6. On the other hand, in the first embodiment, as shown in the drawing 6B, repeaters RPTs are provided in the first predecode lines PDL1. Then, the first pre-decode line PDL1 includes a first portion from the control circuit to the repeater, so as to include a second portion P2 ahead of the repeater when viewed from the control circuit. In this case, since the first portion P1 is connected to the three main decoders MD and the repeater RPT, the fan-out is 4. Since the second portion P2 is connected to the three main decoders MD, the fan-out is 3.

The number of fan-outs of the first portion P1 or the second portion P2 of the first predecode line PDL1 having a larger number of fan-outs is referred to as the largest number of fan-outs. When the maximum fanout is large, the load capacitance by logic gates becomes large and the delay becomes long.

Since the maximum fan-out is 4 in the example of the drawing 6B, the maximum fan-out of the first predecode line PDL1 can be reduced as compared with the example of the drawing 6A in which the maximum fan-out is 6. Consequently, compared with the exemplary embodiment shown in FIG. 6A, the loading capacitance of the logic gate with respect to the first pre-decode line PDL1 can be reduced, and the delay of the signal traveling through the first pre-decode line PDL can be reduced.

In the first embodiment, by inserting the repeater RPT into the first predecode line PDL1, the fan-out of the first predecode line PDL1 can be reduced and the loading capacitance can be reduced. The delay of the first pre-decoded signal PDS1 transmitted from the control circuit CTRL to the main decoders MD via the first pre-decoding line PDL can be suppressed, and the delay until the potential of the word line WL changes can be suppressed according to the internal clock signal ICLK. As a result, there is an effect that the operation of the memory circuit MCT is increased.

Further, by providing the repeater in the peripheral well tap region PWT, the repeater RPT can be provided without increasing the length L of the memory cell row MR in the Y direction. If the repeater is provided in the drive region DR, the length L of the memory cell row in the Y direction is longer than the length L of the other memory cell rows in the Y direction for the row in which the repeater is provided. As a result, the symmetry of the memory cell MC collapses, which causes manufacturing variations. On the other hand, by providing the repeater RPT in the peripheral well tap region PWT as in the first embodiment, it is possible to suppress that the length L of the memory cell row MR in the Y direction differs for each memory cell row MR. Further, by providing a repeater in the existing well tap region, it is possible to suppress an increase in the area due to the repeater, and an effect of saving the area is obtained.

Embodiment 2

Figure 7:
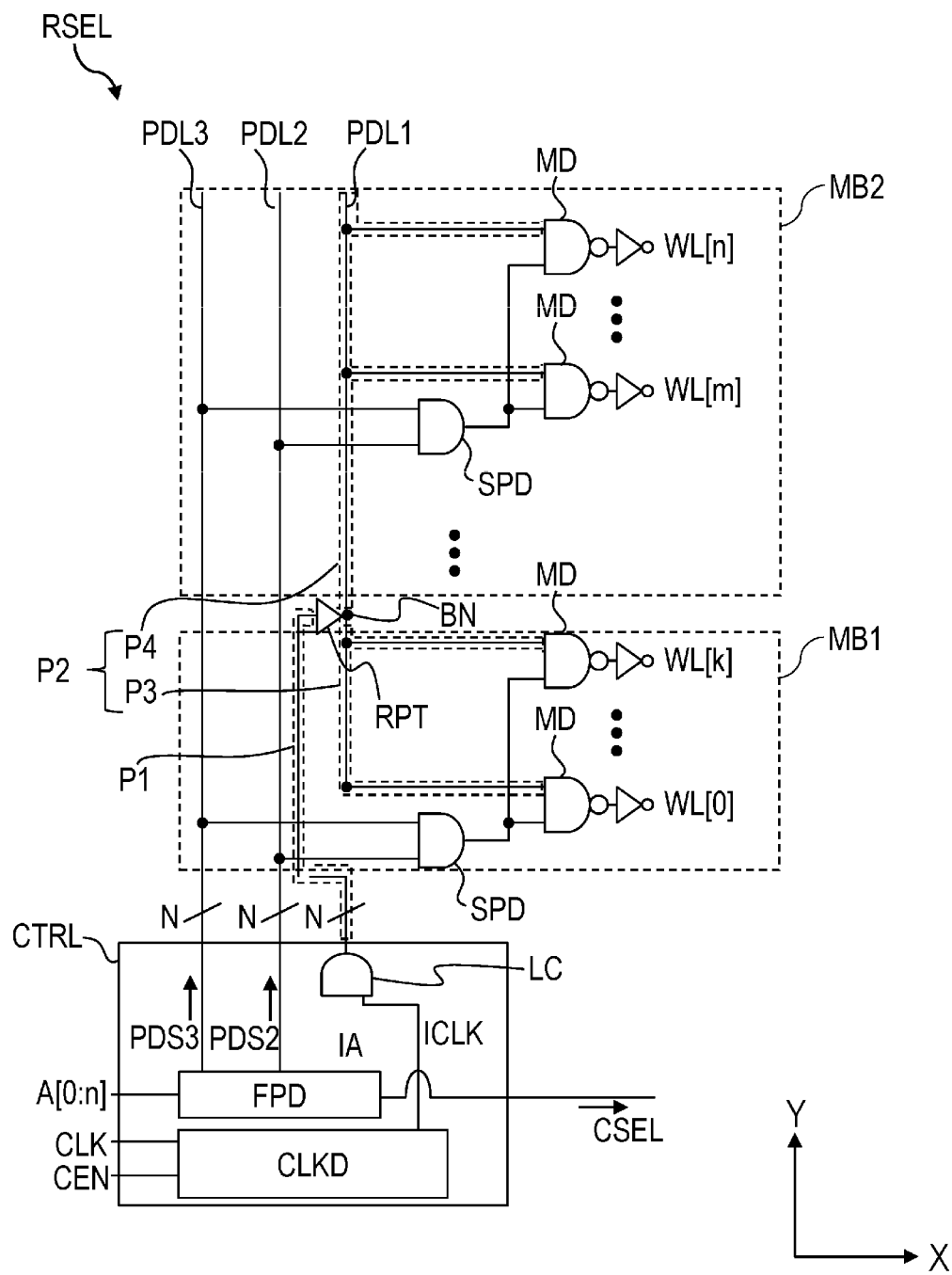
FIG. 7 is an example of a circuit diagram of a main part of a semiconductor memory device according to a second embodiment.
Figure 8:
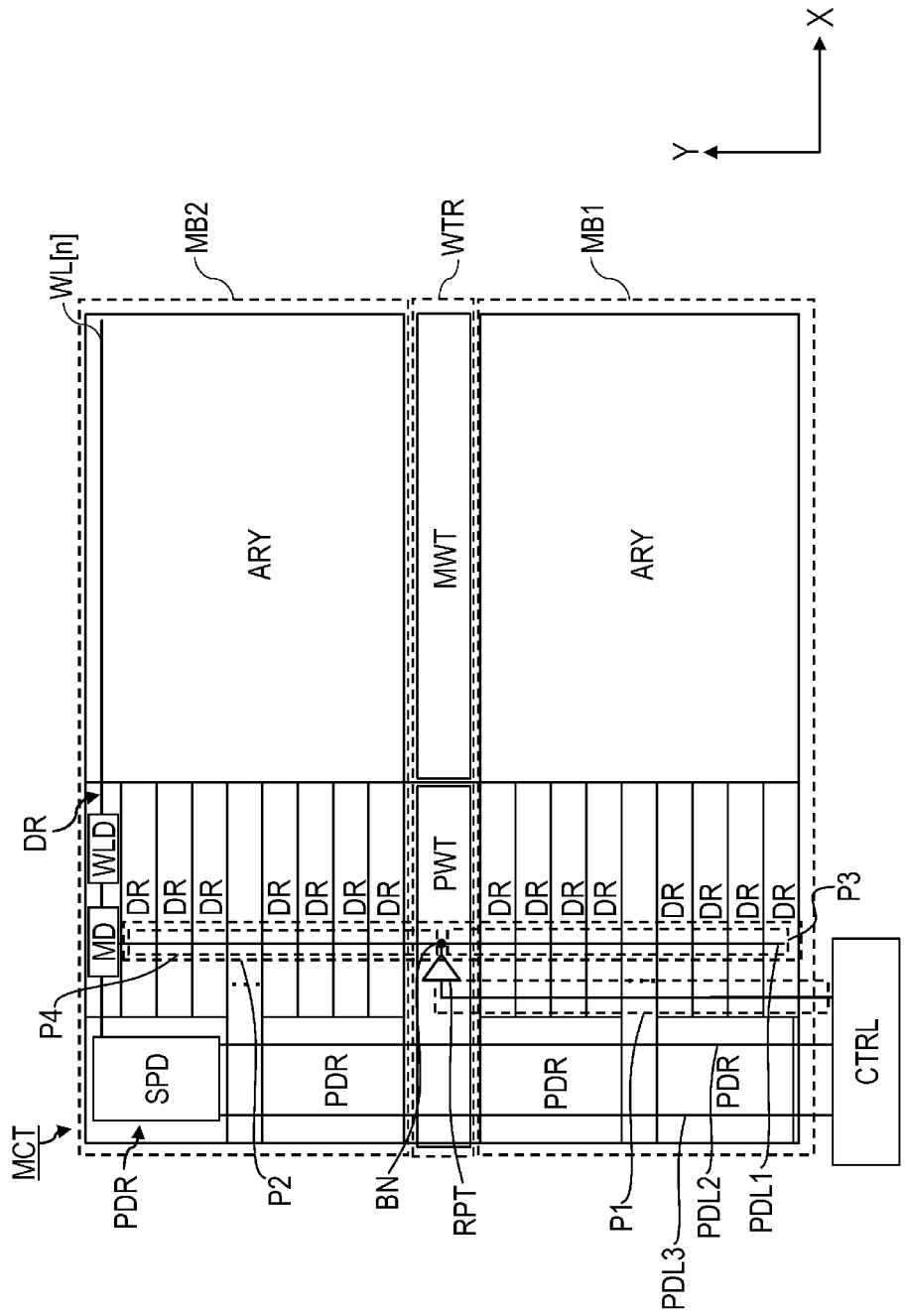
FIG. 8 is an example of a plan layout diagram of the second embodiment.

FIG. 7 is a circuit diagram of a row selection circuit RSEL and the control circuit CTRL in the second embodiment. FIG. 8 is a plan layout diagram of the memory circuit MCT according to the second embodiment. In the second embodiment, as shown in FIGS. 7 and 8, the first predecode line PDL1 branches at the branch node BN. Further, the main decoder MD is not connected to the first part of the first predecode line PDL1 which is closer to the control circuit CTRL than the repeater RPT. The rest of the configuration is the same as that of the first embodiment, and therefore description thereof is omitted.

The first predecode line PDL1 includes a first portion P1 from the control circuit to the repeater RPT, and a second portion P2 ahead of the repeater when viewed from the control circuit CTRL. The main decoder MD is not connected to the first portion P1.

The second portion P2 includes a third portion P3 from the repeater RPT to the main decoder MD included in the memory block MB1, and a fourth portion P4 from the repeater RPT to the main decoder MD included in the memory block MB2. The third part P3 extends from the repeater RPT in a direction approaching the control circuit CTRL in the Y direction. The third portion P3 is connected to the main decoder MD of the memory block MB1. On the other hand, the fourth part P4 extends from the repeater RPT in a direction away from the control circuit CTRL in the Y direction. The fourth part P4 is connected to the main decoder MD of the memory block MB2.

As shown in FIG. 8, the repeater RPT is formed in the peripheral well tap region PWT. Then, the branch node BN, in a plan view, is provided at a position overlapping the peripheral well tap region PWT.

Figure 9:
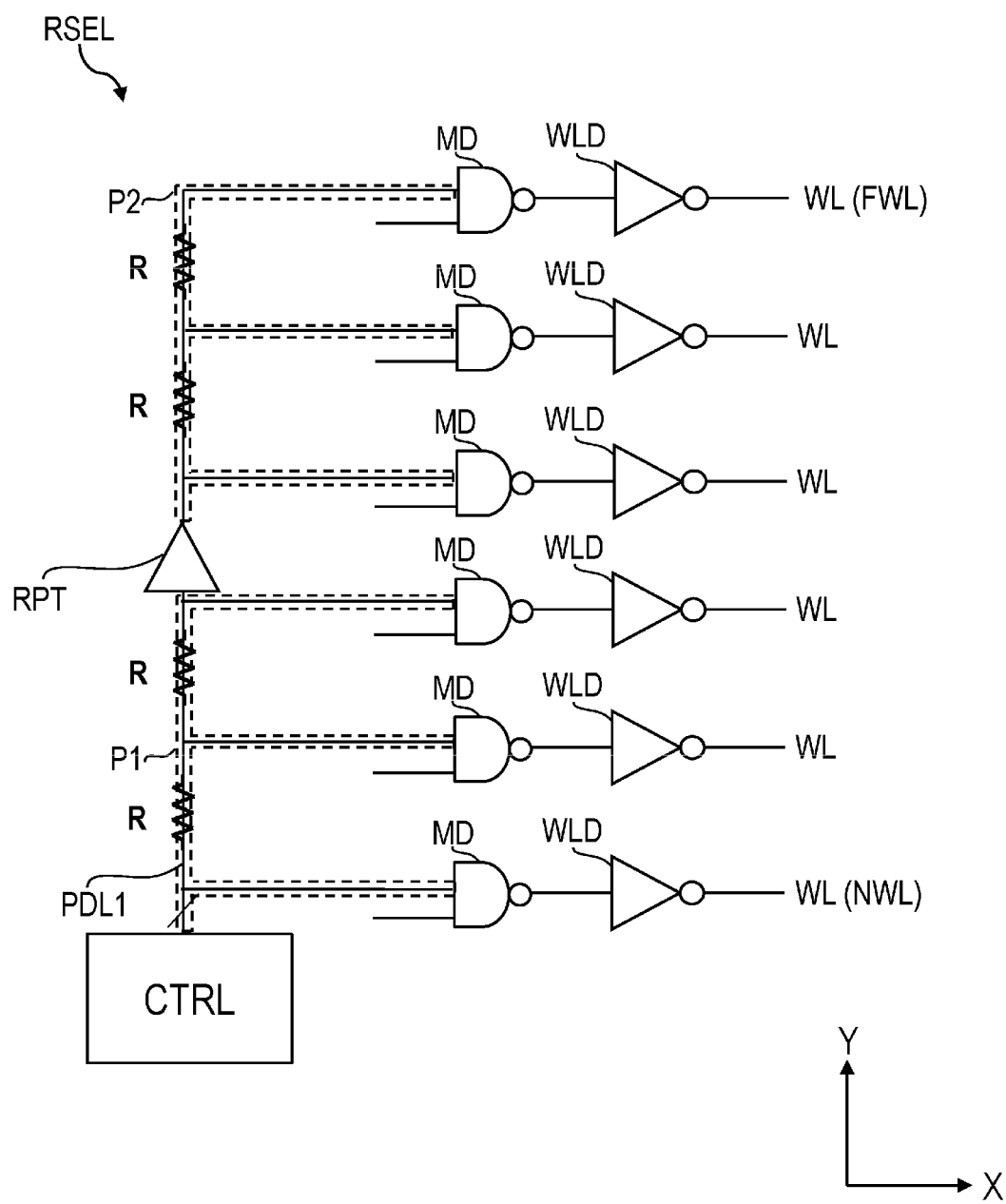
FIG. 9 is a diagram for explaining the problem in the second embodiment.

FIG. 9 is a diagram showing a problem in Embodiment 2. 9, a row selection circuit RSEL which simplifies the configuration of the first embodiment is shown. Here, six word lines WL corresponding to six rows of memory cells are shown. In order to indicate the direction, the right side of the paper surface is defined as the +X direction, the left side of the paper surface is defined as the −X direction, the upper side side of the paper surface is defined as the +Y direction, and the bottom side of the paper surface is defined as the −Y direction. For the control circuit CTRL, the word line WL having the shortest distance in the Y direction is referred to as the near-end word line NWL, and for the control circuit CTRL, the word line WL having the longest distance in the Y direction is referred to as the far-end word line FWL. The first pre-decode line PDL1 includes a first portion from the control circuit to the repeater, and a second portion P2 ahead of the repeater when viewed from the control circuit.

In FIG. 9, a parasitic resistor generated with respect to the first predecode line PDL1 for each memory cell row MR is denoted by R. In this case, since four parasitic resistors R are connected in series in the section from the control circuit CTRL to the main decoder MD connected to the far-end word line FWL, the combined resistors are 4R. On the other hand, in the simplified example of the second embodiment shown in FIG. 10, the output of the repeater RPT is connected to three word lines WL arranged in the +Y direction with respect to the branch node BN and three word lines WL arranged in the −Y direction with respect to the branch node BN via the branch node BN. As a result, the combined resistor received from the repeater to the far-end wordline FWL becomes the R'+2R. The magnitude relation between R' and R differs depending on the condition at the time of designing, but when R' is smaller than 2R, R'+2R is smaller than 4R. Therefore, the combined resistor of the first pre-decoded line PDL1 can be made smaller in a section from the control circuit CTRL to the far-end word line FWL than in the case shown in FIG. 9. As a result, compared with the memory circuit MCT in the first embodiment, the time for the signal to reach from the control circuit CTRL to the far-end word line FWL can be shortened, and the operation of the memory circuit MCT is increased.

Further, by equalizing the distance from the repeater RPT to the far-end word line FWL and the distance from the repeater RPT to the near-end word line NWL, it is possible to substantially eliminate the time difference between the time when the signal reaches the near-end word line NWL from the control circuit CTRL and the time when the signal reaches the far-end word line FWL from the control circuit CTRL, and it is possible to set the time of the operation margins considering the delay of the signal to be short. As a result, there is an effect that the operation of the memory circuit MCT is increased.

In the example shown in FIG. 7, the word line WL[0] in the 0th row is the near-end word line, and the word line WL[n] in the nth row is the far-end word line. As described with reference to FIGS. 9 and 10, in the memory circuit MCT according to the second exemplary embodiment, the wiring resistance from the control circuit CTRL to the far-end word line WL [n] can be reduced as compared with the first exemplary embodiment. Consequently, the delay time until the signal reaches from the control circuit CTRL to the far-end word-line WL[n] can be shortened, and the operation of the memory circuit MCT is effective to increase the speed. Further, in the memory circuit MCT according to the second embodiment, since the distance from the repeater RPT to the far-end word line WL[n] and the distance from the repeater RPT to the near-end word line WL[0] are substantially equal to each other, the time until the signal reaches each of the near-end word line WL[0] and the far-end word line WL[n] from the control circuit CTRL is substantially equal, and the time of the operation margin considering the signal delay can be set short. As a result, there is an effect that the operation of the entire memory circuit MCT is increased.

Figure 10:
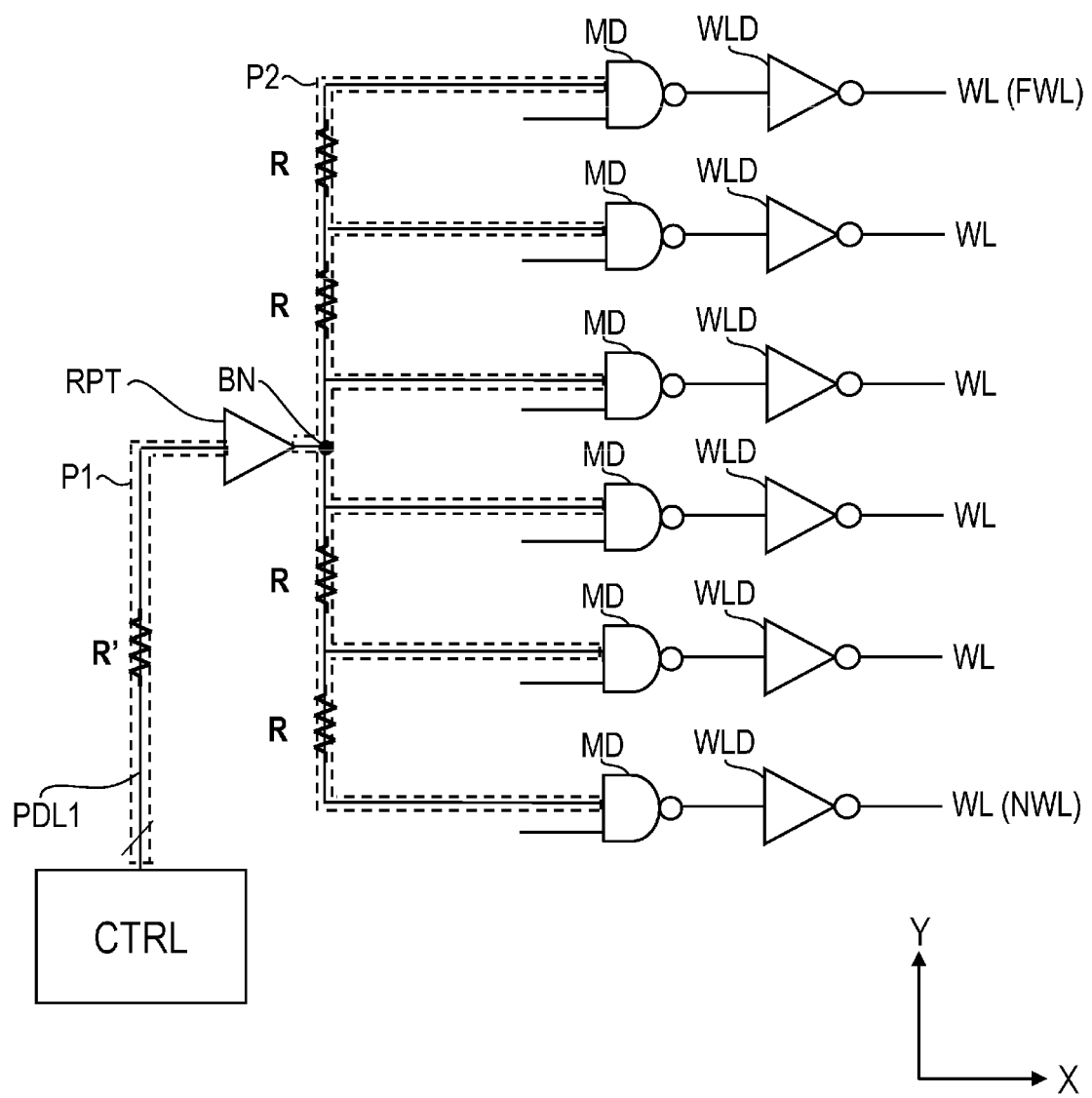
FIG. 10 is a diagram illustrating the effect of the second embodiment.

In the example of FIG. 10, the fan-out of the first portion P1 is 1, and the fan-out of the second portion P2 is 6.

Embodiment 3

Figure 11:
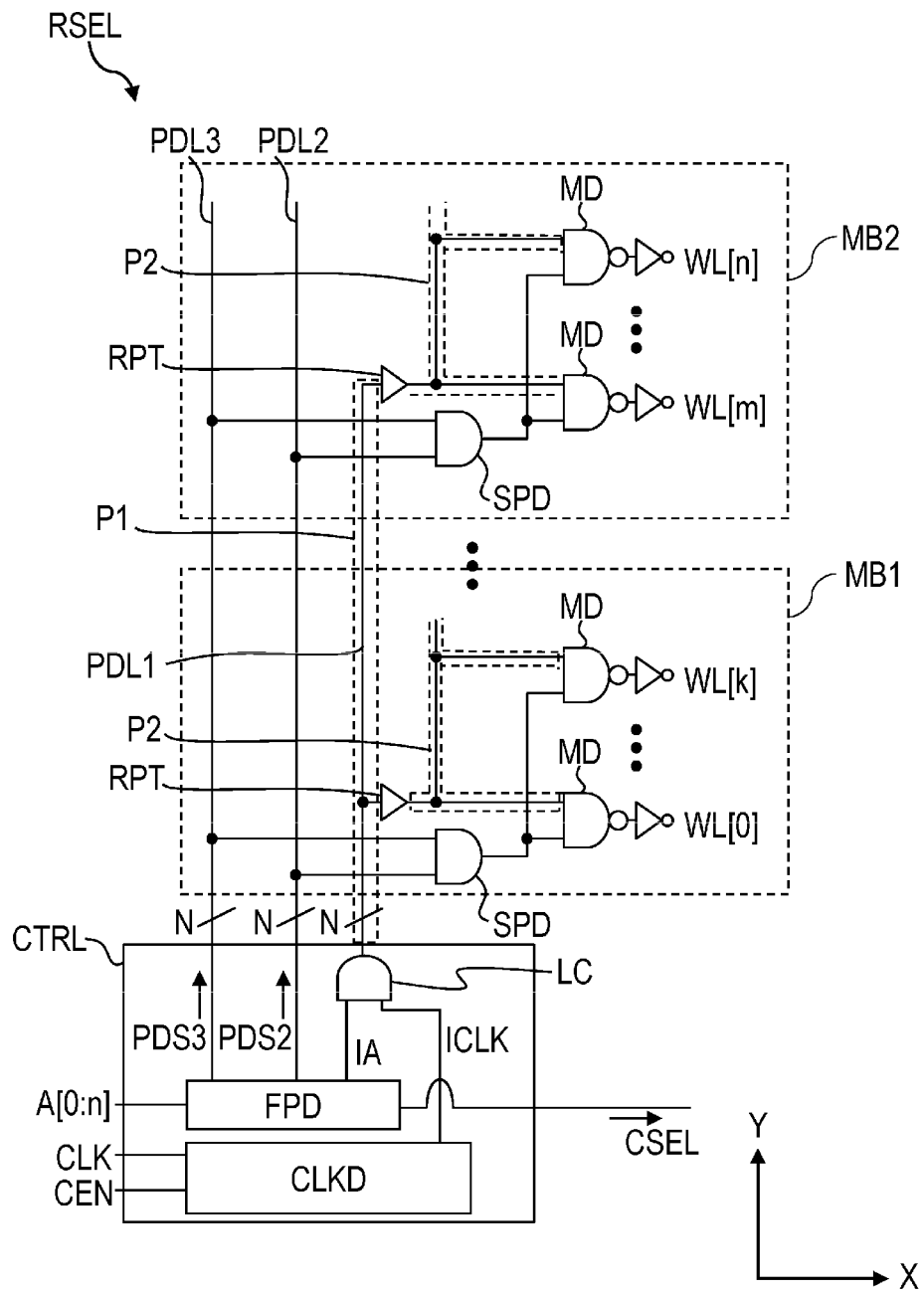
FIG. 11 is an example of a circuit diagram of a main part of the semiconductor memory device according to a third embodiment.
Figure 12:
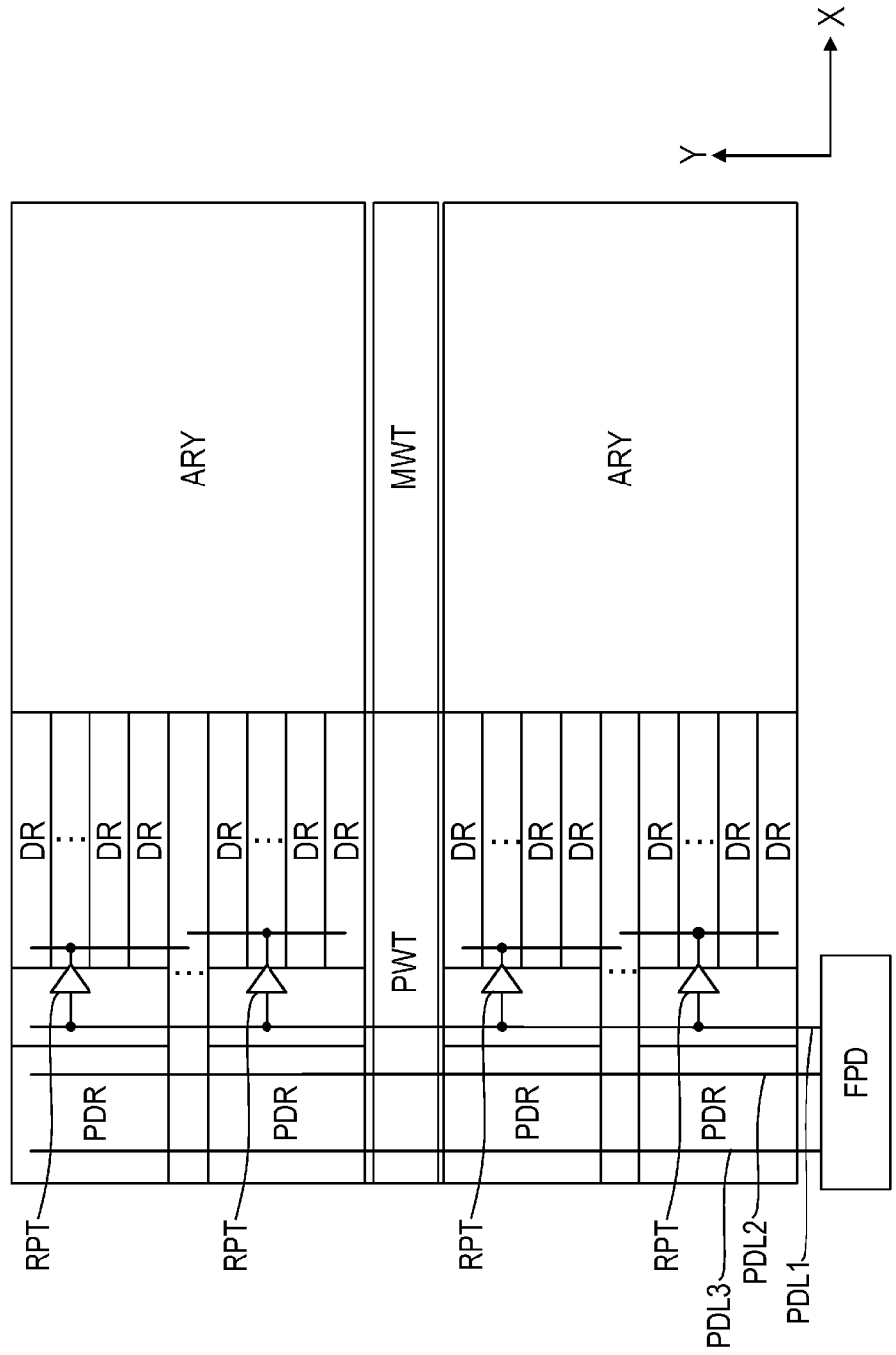
FIG. 12 is an example of a plan layout diagram of the third embodiment.
Figure 13:
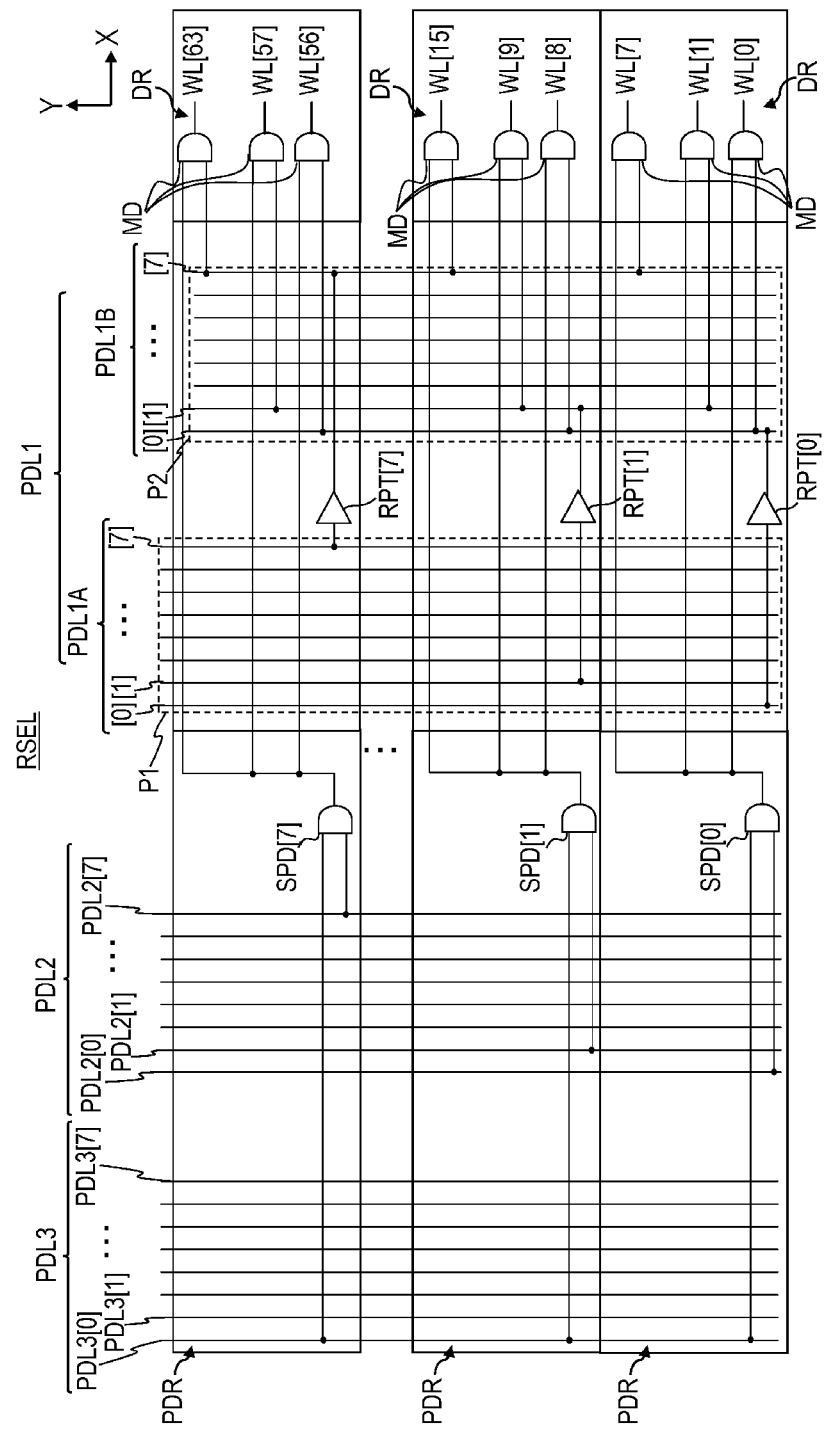
FIG. 13 is an example of a detailed circuit diagram and a plan layout diagram of the third embodiment.

FIG. 11 is a circuit diagram of a row selection circuit RSEL in the third embodiment. FIG. 12 is a plan view of a memory circuit MCT in the third embodiment, and FIG. 13 is a detailed circuit diagram of the row select circuit RSEL of the third embodiment and in the third embodiment of the plan layout diagram, a repeater RPT is provided for each second pre-decoder SPD. The rest of the configuration is the same as that of the first embodiment, and therefore description thereof is omitted.

In FIG. 11, in the memory block MB1, one repeater RPT is provided for each memory cell row of the (k+1) row connected to the second pre-decoder SPD. Further, in the memory block MB2, one repeater RPT is provided for each memory cell row of (n−m+1) rows.

FIG. 12 is a plan view of a memory circuit MCT in the third embodiment. In the X direction, a repeater RPT is disposed between the predecoder layer PDR and the driver region DR. Since the second predecoder SPD is arranged in the predecoder region PDR and the main decoder MD is arranged in the driver region DR, it can be said that the repeater RPT is arranged between the second predecoder SPD and the main decoder MD.

FIG. 13 is a detailed schematic and plan layout diagram of a row select circuit RSEL for N=8 in embodiment 3. Here, each of the first predecode line PDL1, the second predecode line PDL2, and the third predecode line PDL3 is composed of eight wires. The number of memory cell rows included in the memory circuit MCT is 8×8×8=512 rows. That is, the number of word lines WL included in the memory circuit MCT is 512. In FIG. 13, among the 512 rows of memory cells, rows 0 to 63 are shown. In the memory circuit MCT, the same configuration as in FIG. 13 is continuously repeated in the Y direction.

The first part P1 of the first pre-decode line PDL1 includes a routing PDL1A [0:7] extending in the Y-direction. Note that a is an integer of 0 or more and b is an integer larger than a, and the notation wiring [a:b] indicates a plurality of (b−a+1) wirings from the wiring [a] to the wiring [b]. The second part P2 of the first predecode line PDL1 includes wirings PDL1B[0:7] extending in the Y-direction. Assuming k is an integer from 0 to 7, PDL1A [k] is connected to PDL1B [k] via the repeater RPT [k]. For example, the wiring PDL1A [0] is connected to each other with the wiring PDL1B [0] via the repeater RPT [0]. Wiring PDL1A [1] is connected to each other with the wiring PDL1B [1] via the repeater RPT [1]. Then, the wiring PDL1A [7] is connected to each other with the wiring PDL1B [7] via the repeater RPT [7].

The second pre-decode line PDL2 includes a plurality of routing PDL2 [0:7] extending in the Y-direction. When p is an integer equal to or greater than 0, the second predecode line PDL2[p] is connected to one of the inputs of the second predecoder SPD[p].

The third pre-decode line PDL3 includes a plurality of routing PDL3 [0:7] extending in the Y-direction. Like the second predecode line PDL2, the third predecode line PDL3 [p] is connected to the other input terminal of the second predecoder SPD[p].

In the embodiment shown in FIG. 13, all of the input terminals of the second predecoder SPD connected to the third predecode line PDL3 are connected to the third pre-decode line PDL3[0]. Although not shown, in succession in the Y-direction of the drawing, among the input terminals of the second pre-decoder SPD, the portion connected to the third pre-decoding line PDL [1] is PDL3 [1], PDL3 [2], . . . PLD3 [7] circuit is provided which is changed in the order.

The repeater RPT is arranged in an extending direction in the X direction of the second predecoder SPD in the X direction. The repeater RPT[p] is provided in the extending direction of the second predecoder SPD[p] in the X direction.

Figure 14:
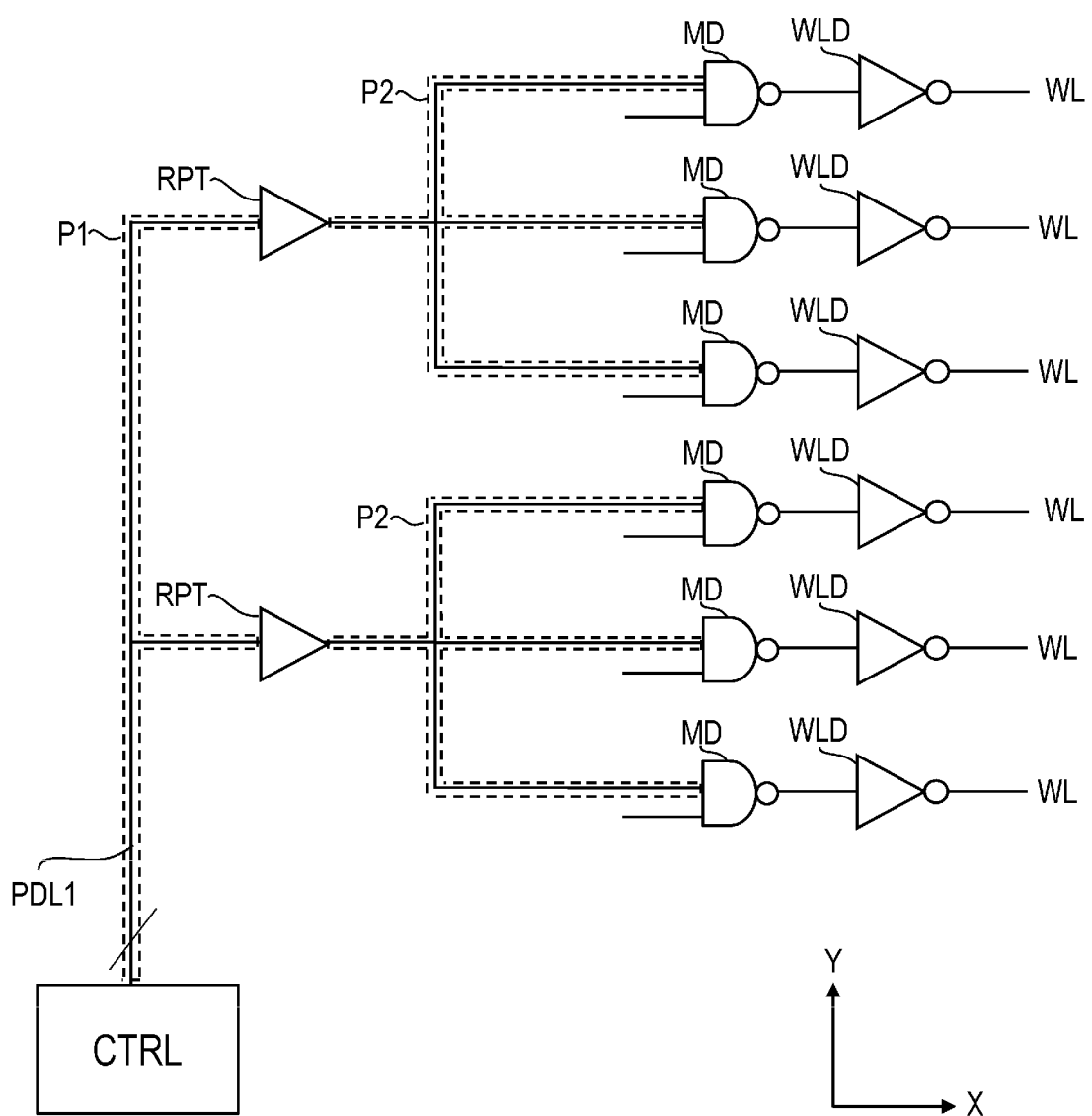
FIG. 14 is a diagram illustrating the effect of the third embodiment.

FIG. 14 is a simplified example of Embodiment 3. The first part P1 of the first predecode line PDL1 is connected to two repeaters RPT. Therefore, the fan-out of the first portion P1 is 2. The second part P2 of the first predecode line PDL1 is connected to three main decoders MD. Therefore, the fanout of the second portion P2 is 3.

In the case shown in the drawing 6B of the first embodiment, the largest fanout of the wire PDL1 is 4. Further, in the case shown in FIG. 10 of the second embodiment, the largest fanout of the wire PDL1 is 6. On the other hand, in the embodiment 3 shown in FIG. 14, the largest fanout of the wire PDL1 is 3. Therefore, in the third embodiment, as compared with the first and second embodiments, it is possible to reduce the maximum fanout, there is an effect of suppressing the delay of the signal.

It should be noted that the present invention is not limited to the above-mentioned embodiments, and various modifications can be made without departing from the gist thereof.

In addition, even when a specific numerical value example is described, it may be a numerical value exceeding the specific numerical value, or may be a numerical value less than the specific numerical value, except when it is theoretically obviously limited to the numerical value.

What is claimed is:

1. A semiconductor memory device comprising:
a semiconductor substrate having a main surface;
a first memory cell row having a plurality of first memory cells arranged in parallel to a first direction in plan view on the main surface;
a first word line connected to the plurality of first memory cells;
a first word line driver configured to change a potential of the first word line;
a control circuit configured to output a first pre-decode signal to the first word line driver via the first pre-decode line in response to a clock signal and an address signal; and
a repeater circuit inserted in the first pre-decode line between the control circuit and the first word line driver,
wherein the control circuit outputs a second pre-decode signal to a second pre-decode line different from the first pre-decode line in response to the address signal,
wherein the control circuit includes:
a first pre-decoder;
a logic circuit connected to the first pre-decode line; and
a clock driver configured to output an internal clock signal in response to an input of the clock signal,
wherein the first pre-decoder outputs an internal address signal to the logic circuit in response to the address signal, and outputs the second pre-decode signal to the second pre-decode line,
wherein the logic circuit outputs the first pre-decode signal to the first pre-decode line in response to the internal clock signal and the internal address signal,
wherein the first pre-decoder outputs a third pre-decode signal to a third pre-decode line different from the first pre-decode line and the second pre-decode line in response to the address signal, and
wherein the semiconductor memory device further includes:
a second pre-decoder connected to the second pre-decode line and the third pre-decode line and outputting a fourth pre-decode signal to a fourth pre-decode line and the first pre-decode line in response to the second pre-decode signal and the third pre-decode signal; and
a main decoder connected to the fourth pre-decode line and the first pre-decode line and outputting a fifth pre-decode signal to the first word line driver in response to the fourth pre-decode signal and the first pre-decode signal.

2. The semiconductor memory device according to claim 1, wherein each of the plurality of first memory cells comprises a fin-type field effect transistor.

3. The semiconductor memory device according to claim 1, further comprising:
a second memory cell row having a plurality of second memory cells arranged in an extending direction of the first memory cell row, the second memory cell row being arranged in parallel to the first direction in a second direction intersecting with the first direction in the plan view;
a second word line connected to the plurality of second memory cells; and
a second word line driver configured to change a potential of the second word line,
wherein one of the first memory cell row or the second memory cell row is selected by the address signal,
wherein the first pre-decode line transmits the first pre-decode signal to the first word line driver or the second word line driver,
wherein the repeater is inserted between the control circuit and the first word line driver, and
wherein the repeater is not inserted in a position between the control circuit and the second word line driver.

4. The semiconductor memory device according to claim 1,
wherein the first pre-decode line comprises:
a first portion from the repeater to the control circuit; and
a second portion from the repeater to the first word line driver, and
wherein the repeater providing, in response to the first pre-decode signal, the second portion with a second potential corresponding to a high level of the first pre-decode signal or a second potential corresponding to a low level of the first pre-decode signal.

5. The semiconductor memory device according to claim 1, wherein the repeaters comprises an even number of CMOS inverters connected in series.

6. The semiconductor memory device according to claim 1,
wherein the first memory cell row is included in a memory cell array,
wherein the first word line driver is included in a peripheral region located in an extension direction of the memory cell array in the first direction in a planar view, and
wherein the semiconductor memory device further comprises:
a memory well tap region arranged in an extending direction of the memory cell array in a second direction intersecting the first direction in the plan view and supplying a well power to the first memory cell; and
a peripheral well tap region arranged in an extending direction of the memory well tap region in the second direction and supplying the well power to the first word line driver,
wherein the repeater is located in the peripheral well tap region.

7. The semiconductor memory device according to claim 1, wherein the repeater is not inserted into the first pre-decode line.

8. The semiconductor memory device according to claim 1, wherein the first pre-decode line comprises a first portion closer to the first pre-decoder than the repeater and a second portion closer to the first word line driver than the repeater,
wherein the second portion includes a third portion extending in a second direction intersecting the first direction in the plan view and a fourth portion extending in the second direction and different from the third portion,
wherein the third portion is connected to the main decoder, and wherein the first portion is not connected to the main decoder.

9. The semiconductor memory device according to claim 1, wherein the repeater is provided between the second pre-decoder and the main decoder.

10. A semiconductor memory device comprising:
a semiconductor substrate having a main surface;
a first memory cell row having a plurality of first memory cells arranged in parallel to a first direction in a plan view on the main surface;
a first word line connected to the plurality of first memory cells;
a first word line driver arranged in an extending direction of the first memory cell row in the first direction and changing a potential of the first word line;
a memory well tap region arranged in an extending direction of the first memory cell row in a second direction intersecting the first direction in the plan view, and supplying a well power to the first memory cell row;
a peripheral well tap region arranged in an extending direction of the first word line driver in the second direction and supplying a well power to the memory well tap region arranged in an extending direction of the first word line driver in the first direction, and supplying a well power to the first word line driver in the first direction; and
a control circuit having a first pre-decode signal output to the first word line driver via a first pre-decode line in response to a clock signal and an address signal,
wherein the first pre-decode line includes a first portion from the control circuit to a first repeater disposed in the peripheral well tap region, and a second portion from the first repeater to the first word line driver,
wherein the control circuit outputs a second pre-decode signal to a second pre-decode line different from the first pre-decode line in response to the address signal,
wherein the control circuit includes:
a first pre-decoder;
a logic circuit connected to the first pre-decode line; and
a clock driver for outputting an internal clock signal in response to an input of the clock signal,
wherein the first pre-decoder outputs an internal address signal to the logic circuit in response to the address signal, and outputs the second pre-decode signal to the second pre-decode line,
wherein the logic circuit outputs the first pre-decode signal to the first pre-decode line in response to the internal clock signal and the internal address signal,
wherein the first pre-decoder outputs a third pre-decode signal to a third pre-decode line different from the first pre-decode line and the second pre-decode line in response to the address signal, and
wherein the semiconductor memory device further includes:
a second pre-decode connected to the second pre-decode line and the third pre-decode line and outputting a fourth pre-decode signal to a fourth pre-decode line;
the first pre-decode line in response to the second pre-decode signal and the third pre-decode signal; and
a main decoder connected to the fourth pre-decode line and the first pre-decode line and outputting a fifth pre-decode signal to the first word line driver in response to the fourth pre-decode signal and the first pre-decode signal.

11. The semiconductor memory device according to claim 10, further comprising:
   a second memory cell row having a plurality of second memory cells arranged in the extending direction of the first memory cell row in the second direction with the memory well tap region interposed therebetween;
   a second word line connected to the plurality of second memory cells; and
   a second word line driver arranged in the extending direction of the second memory cell row in the first direction and varying the potential of the second word line,
   wherein the control circuit outputs the first pre-decode signal to the first word line driver via the first pre-decode line in response to the clock signal and the address signal, and wherein the second portion of the first pre-decode line includes:
   the second portion from the first repeater to the first word line driver; and
   a third portion from the first repeater to the second word line driver.

12. The semiconductor memory device according to claim 10, wherein the first repeater supplies a first potential corresponding to a high level of the first pre-decode signal or a second potential corresponding to a low level of the first pre-decode signal to the second portion in response to the first pre-decode signal.

13. The semiconductor memory device according to claim 10, wherein a second repeater is provided between the second pre-decoder and the main decoder.

* * * * *